United States Patent
Kang et al.

(10) Patent No.: US 10,553,821 B2
(45) Date of Patent: *Feb. 4, 2020

(54) FLEXIBLE DISPLAY APPARATUS

(71) Applicant: SAMSUNG DISPLAY CO., LTD., Yongin-si, Gyeonggi-do (KR)

(72) Inventors: Kinyeng Kang, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/944,051

(22) Filed: Apr. 3, 2018

(65) Prior Publication Data

US 2018/0226613 A1    Aug. 9, 2018

Related U.S. Application Data

(63) Continuation of application No. 15/156,874, filed on May 17, 2016, now Pat. No. 9,966,564.

(30) Foreign Application Priority Data

Sep. 15, 2015    (KR) .................. 10-2015-0130597

(51) Int. Cl.
*H01L 51/52* (2006.01)
*H01L 27/32* (2006.01)

(52) U.S. Cl.
CPC ........ *H01L 51/5253* (2013.01); *H01L 27/323* (2013.01); *H01L 27/3246* (2013.01); *H01L 27/3276* (2013.01); *H01L 2251/5338* (2013.01)

(58) Field of Classification Search
CPC ........... H01L 2251/5338; H01L 27/323; H01L 27/3246; H01L 27/3248; H01L 27/3258; H01L 27/3276; H01L 51/5237; H01L 51/525; H01L 51/5253; H01L 51/5256
See application file for complete search history.

(56) References Cited

U.S. PATENT DOCUMENTS

| | | |
|---|---|---|
| 9,287,329 B1 * | 3/2016 | Lee ............... H01L 51/0097 |
| 2007/0181872 A1 | 8/2007 | Lee et al. |
| 2013/0126890 A1 | 5/2013 | Bedell et al. |
| | (Continued) | |

FOREIGN PATENT DOCUMENTS

KR    1020150015257 A    2/2015

OTHER PUBLICATIONS

Sean Garner et al., Flexible glass substrates for roll-to-roll manufacturing, 2011, 5 pages, Corning Incorporated, Corning, NY.

*Primary Examiner* — Mohammed Shamsuzzaman
(74) *Attorney, Agent, or Firm* — Cantor Colburn LLP

(57) ABSTRACT

A flexible display apparatus includes: a substrate; a gate insulating layer including an inorganic layer disposed on the substrate; a gate line disposed on the gate insulating layer; an inter-insulating layer including an inorganic layer and covering the gate line; and a data line disposed on the inter-insulating layer, where the flexible display apparatus has a first region which is bendable and second regions at opposite sides of the first region, respectively, portions of the gate insulating layer and the inter-insulating layer in the first region are removed, and the gate insulating layer and the inter-insulating layer in the second region have a patterned structure.

13 Claims, 7 Drawing Sheets

(56) References Cited

U.S. PATENT DOCUMENTS

| | | |
|---|---|---|
| 2015/0014650 A1 | 1/2015 | Lim et al. |
| 2015/0036299 A1 | 2/2015 | Namkung et al. |
| 2015/0060778 A1* | 3/2015 | Kim .................... H01L 27/3258 257/40 |
| 2016/0005803 A1* | 1/2016 | Ryu .................... H01L 27/3248 257/40 |
| 2017/0149017 A1* | 5/2017 | Lee .................... H01L 51/5243 |

* cited by examiner

FLEXIBLE DISPLAY APPARATUS

This application is a continuation of U.S. patent application Ser. No. 15/156,874, filed on May 17, 2016, which claims priority to Korean Patent Application No. 10-2015-0130597, filed on Sep. 15, 2015, and all the benefits accruing therefrom under 35 U.S.C. § 119, the content of which in its entirety is herein incorporated by reference.

BACKGROUND

1. Field

One or more exemplary embodiments relate to a flexible display apparatus.

2. Description of the Related Art

As information technology has developed, the market for display apparatuses that are connecting media between users and information is increasing. Accordingly, usage of flat panel displays ("FPD"s), such as liquid crystal displays ("LCD"s), organic light-emitting diodes ("OLED"s), and plasma display panels ("PDP"s) have increased.

If a display apparatus has flexibility, the display apparatus is portable in a state of being curved, folded, or rolled, and accordingly, portability may be ensured while increasing a screen size of the display apparatus.

Accordingly, research on commercializing a display apparatus including a flexible display panel has recently increased.

SUMMARY

One or more exemplary embodiments include a flexible display apparatus.

Additional aspects will be set forth in part in the description which follows and, in part, will be apparent from the description, or may be learned by practice of the presented embodiments.

According to an exemplary embodiment, a flexible display apparatus includes: a substrate; a gate insulating layer including an inorganic layer and disposed on the substrate; a gate line disposed on the gate insulating layer; an inter-insulating layer including an inorganic layer and covering the gate line; and a data line disposed on the inter-insulating layer, where the flexible display apparatus has a first region which is bendable and second regions at opposite sides of the first region, respectively, portions of the gate insulating layer and the inter-insulating layer in the first region are removed, and the gate insulating layer and the inter-insulating layer in the second region have a patterned structure.

In an exemplary embodiment, the data line may include aluminum (Al).

In an exemplary embodiment, the data line may be disposed directly on the substrate, and the data line disposed in the first region may connect portions of the gate line in the second regions, respectively.

In an exemplary embodiment, the flexible display apparatus may further include a metal dam at an edge of each of the second regions, where the metal dam may be spaced from the data line with a predetermined distance apart.

In an exemplary embodiment, the metal dam and the data line may be disposed in a same layer and include a same material as each other.

In an exemplary embodiment, the flexible display apparatus may further include a via layer including an organic layer and covering the data line, where a portion of the via layer in a third region, which is between an end portion of the data line and the metal dam within each second region, is removed.

In an exemplary embodiment, the flexible display apparatus may further include: a pixel defining layer disposed on the via layer; and a spacer disposed on the pixel defining layer.

In an exemplary embodiment, portions of the pixel defining layer and the spacer in a region from the first region to the third region may be removed, and the pixel defining layer and the spacer may be disposed to overlap only the metal dam and a region inside the metal dam in the second region.

In an exemplary embodiment, portions of the pixel defining layer and the spacer in the third region may be removed to overlap the second region except the first region and the third region.

In an exemplary embodiment, the flexible display apparatus may further include a thin film encapsulation portion disposed on the spacer.

In an exemplary embodiment, the thin film encapsulation portion may be disposed on the substrate, and the data line, the via layer and the thin film encapsulation portion may be sequentially disposed on the substrate in the first region.

In an exemplary embodiment, the thin film encapsulation portion may be disposed on the substrate entirely in the second region, except the first region.

In an exemplary embodiment, the flexible display apparatus may further include: a via layer including an organic material and disposed on the data line; and a pixel electrode on the via layer, where a portion of the via layer on the data line in the second region is removed.

In an exemplary embodiment, the pixel electrode may be disposed on the via layer in the first region, and the pixel electrode may connect portions of the data line in the second regions, respectively.

In an exemplary embodiment, the flexible display apparatus may further include a molding portion disposed on the via layer in the first region, on which the thin film encapsulation portion is removed, where the molding portion may include a waterproof coating agent.

In an exemplary embodiment, the flexible display apparatus may further include a touch screen panel ("TSP") line disposed on the via layer in the first region, in which the thin film encapsulation portion is removed, and a TSP protective organic layer disposed on the TSP line.

In an exemplary embodiment, the gate insulating layer and the inter-insulating layer in a bendable portion of the second region are removed, and portions of the gate insulating layer and the inter-insulating layer only on regions, where the gate line and the data line are to be insulated in the second region, have a patterned structure.

According to another exemplary embodiment, a flexible display apparatus includes: a substrate; a gate insulating layer including an inorganic layer and disposed on the substrate; a gate line disposed on the gate insulating layer; an inter-insulating layer including an inorganic layer and covering the gate line; and a data line disposed on the inter-insulating layer. In such an embodiment, the flexible display apparatus has a first region which is bendable and second regions at opposite sides of the first region, respectively, the gate insulating layer and the inter-insulating layer in the second region have a patterned structure, and a portion of the data line in the first region is disposed directly on the substrate.

BRIEF DESCRIPTION OF THE DRAWINGS

These and/or other features will become apparent and more readily appreciated from the following description of the exemplary embodiments, taken in conjunction with the accompanying drawings, in which.

DETAILED DESCRIPTION

Figure 1:
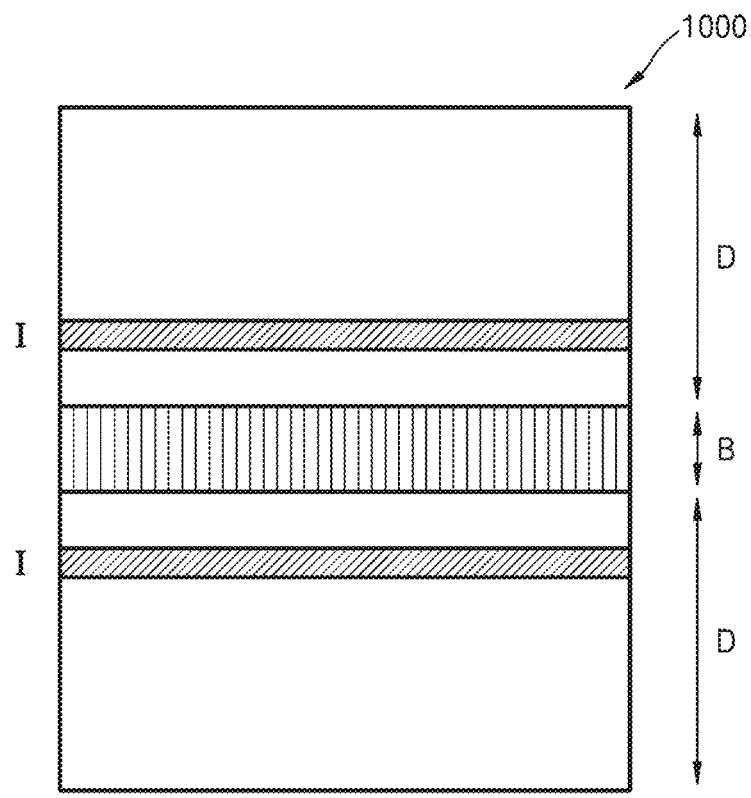
FIG. 1 is a schematic plan view of a flexible display apparatus according to an exemplary embodiment.

As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope are encompassed in the inventive concept. In the description, certain detailed explanations of the related art are omitted when it is deemed that they may unnecessarily obscure the essence of the inventive concept.

While such terms as "first," "second," etc., may be used to describe various components, such components must not be limited to the above terms. The above terms are used only to distinguish one component from another. Thus, "a first element," "component," "region," "layer" or "section" discussed below could be termed a second element, component, region, layer or section without departing from the teachings herein.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
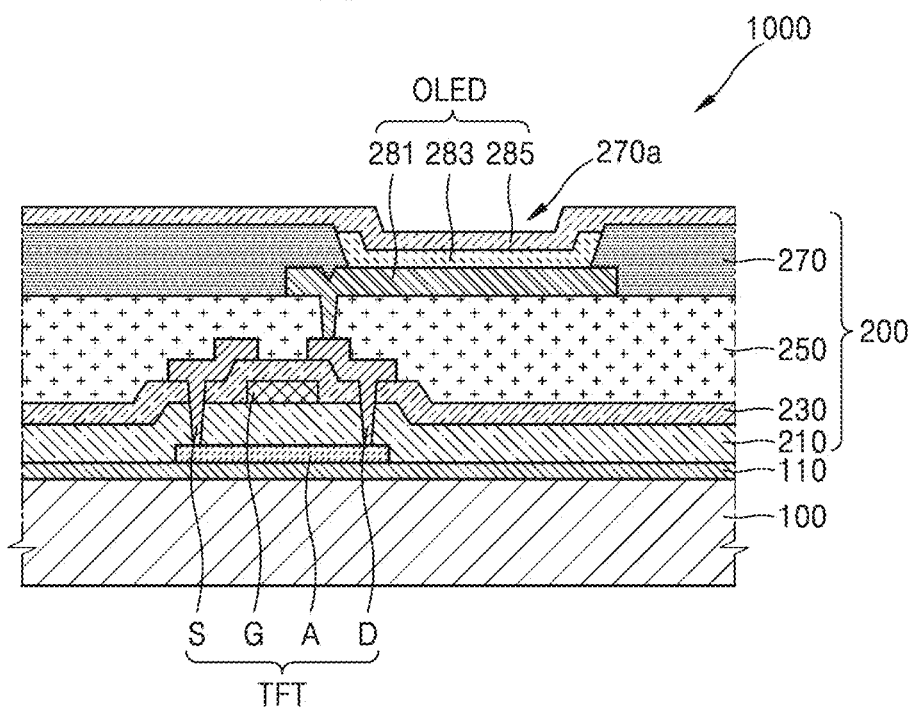
FIG. 2 is a schematic cross-sectional view of an internal portion of a second region in the flexible display apparatus of FIG. 1.
Figure 3:
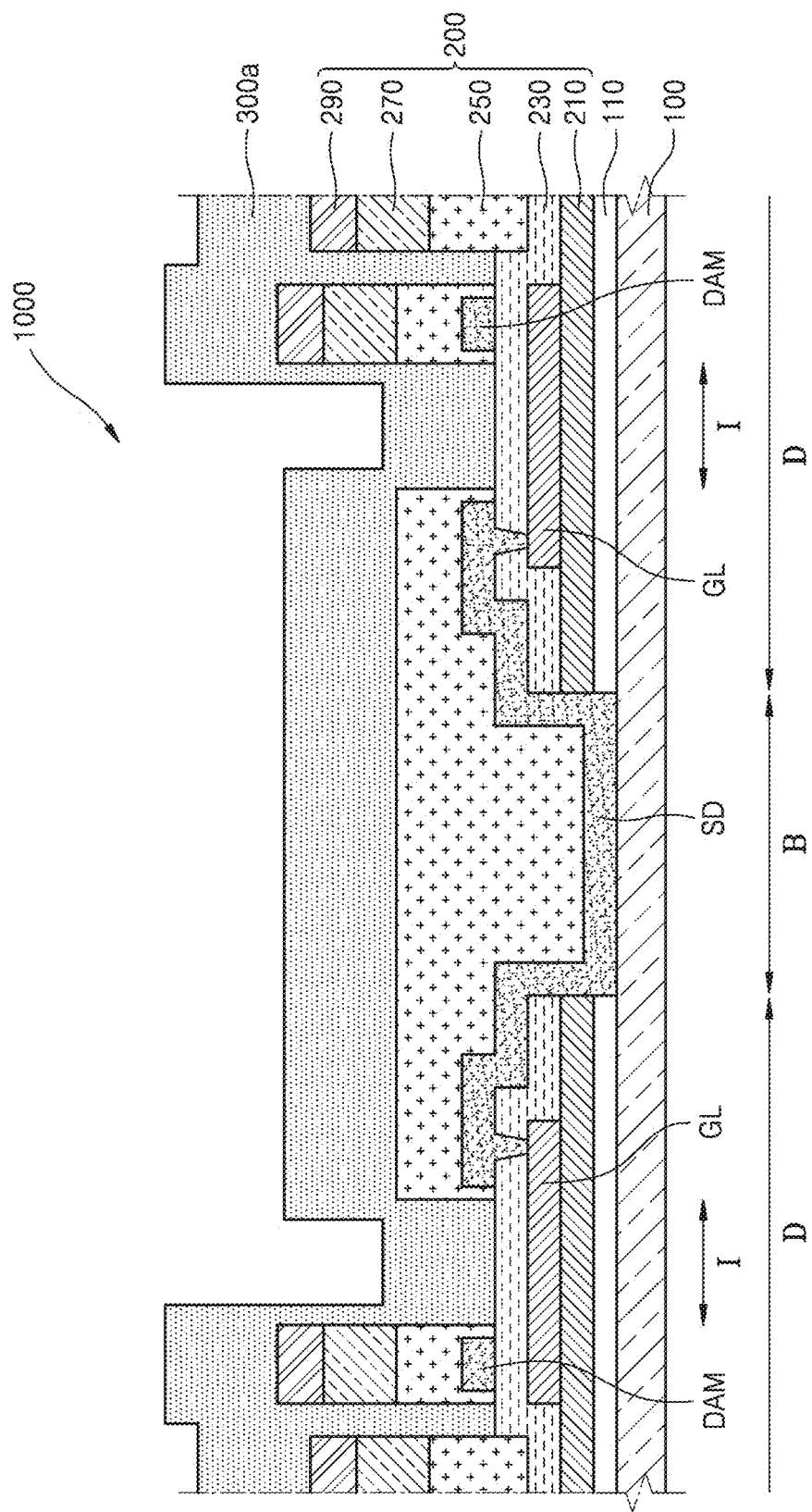
FIG. 3 is a schematic cross-sectional view of edges of a first region and a second region in the flexible display apparatus according to an exemplary embodiment.

FIG. 1 is a schematic plan view of a flexible display apparatus 1000 according to an exemplary embodiment, FIG. 2 is a schematic cross-sectional view showing an internal portion of a second region D in the flexible display apparatus 1000, and FIG. 3 is a schematic cross-sectional view of edge portions of a first region B and the second region D in the flexible display apparatus 1000.

The flexible display apparatus 1000 according to an exemplary embodiment includes a first region B and second regions D.

The first region B is a bending region, at which a display panel is bendable or foldable by an angle of 90° or greater, and the second regions D are flat regions in which a display unit 200 is included.

In an exemplary embodiment, as shown in FIG. 1, two second regions D may be disposed at opposite sides of the first region B, based on the first region B. In such an embodiment, the display panel may be bent at the first region B, and the two second regions D disposed at opposite sides of the first region B may display images to be shown.

In such an embodiment, the flexible display apparatus 1000 may include a third region I disposed on an edge portion of each of the second regions D.

The third region I may be defined by an external portion of the second region D that is adjacent to the first region B.

Alternatively, an organic layer may be removed on the third region I, which will be described later.

Hereinafter, a cross-section of the first region B and an internal cross-section of the display unit 200 located in the second region D will be described below with reference to FIGS. 1 to 3. The display unit 200 emits visible light corresponding to the image to be shown. The display unit 200 may include various devices, for example, an organic light-emitting display diode ("OLED") and a liquid crystal display ("LCD") device. In an exemplary embodiment of the flexible display apparatus 1000, the display unit 200 includes an organic light-emitting diode OLED, as shown in FIG. 2.

The substrate 100 may include various materials, for example, a glass material, other insulating materials, or a metal thin film.

Alternatively, the substrate 100 may include a flexible material, for example, an organic material.

Alternatively, the substrate 100 may include at least one selected from a silicon-based polymer, polyurethane, polyurethane acrylate, acrylate polymer, and acrylate terpolymer. In such an embodiment, the silicon-based polymer may include, for example, polydimethylsiloxane ("PDMS") and hexamethyldisiloxane ("HMDSO").

According to an exemplary embodiment of the flexible display apparatus 1000, the substrate 100 is fabricated to have a flexible property to elongate two-dimensionally.

Alternatively, the substrate 100 may include a material having a Poisson's ratio of about 0.4 or greater. The Poisson's ratio denotes a ratio of compression in one direction when a material is elongated by being pulled in the other direction. When the material forming the substrate 100 has a Poissons's ratio of about 0.4 or greater, that is, the substrate 100 is sufficiently expanded, the flexibility of the substrate 100 may be improved and a bending portion may be defined by the substrate 100. In such an embodiment, the display apparatus 1000 may effectively include the bending portion.

A buffer layer 110 may be disposed on the substrate 100. The buffer layer 110 may function as a barrier layer and/or a blocking layer that effectively prevents dispersion of impurity ions and infiltration of moisture or external air, and that planarizes a surface of the substrate 100.

Alternatively, the buffer layer 110 may include an inorganic layer, and may cover only the second regions D. In such an embodiment, the buffer layer 110 including the inorganic material may be disposed on the substrate 100 and patterned to overlap only the second regions D and to expose the first region B.

A thin film transistor TFT may be disposed on the buffer layer 110. An active layer A of the thin film transistor TFT may include polysilicon, and may include a channel region on which impurities are not doped, and a source region and a drain region disposed on opposite sides of the channel region and doped with impurities. Here, the impurities may vary depending on the thin film transistor TFT, e.g., may be N-type impurities or P-type impurities.

In such an embodiment, a gate insulating layer 210 may be disposed on the active layer A.

The gate insulating layer 210 may have a multi-layered or a single-layered structure including an inorganic material such as silicon oxide or silicon nitride. The gate insulating layer 210 insulates a gate electrode G disposed thereon from the active layer A.

Alternatively, the gate insulating layer 210 including the inorganic material may be patterned to overlap only the second regions D, and to expose the first region B.

In such an embodiment, the gate electrode G may be disposed on the gate insulating layer 210. In an exemplary embodiment, the gate electrode G may be fabricated by a photolithography process and an etching process.

The gate electrode G may include at least one selected from molybdenum (Mo), aluminium (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

In such an embodiment, an inter-insulating layer 230 is disposed on the gate insulating layer 210. In an exemplary embodiment, the inter-insulating layer 230 may be patterned to overlap only the second regions D.

The inter-insulating layer 230 may include an inorganic material. In an exemplary embodiment, the inter-insulating layer 230 may include a metal oxide or a metal nitride. In one exemplary embodiment, for example, the inorganic material may include at least one selected from silicon oxide ($SiO_2$), silicon nitride ($SiN_x$), silicon oxynitride (SiON), aluminium oxide ($Al_2O_3$), titanium oxide ($TiO_2$), tantalum oxide ($Ta_2O_5$), hafnium oxide ($HfO_2$), or zinc oxide ($ZrO_2$).

The inter-insulating layer 230 may have a multi-layered or a single-layered structure including an inorganic material such as silicon oxide ($SiO_x$) and/or silicon nitride ($SiN_x$). In some exemplary embodiments, the inter-insulating layer 230 may have a dual-layer structure such as $SiO_x/SiN_y$ or $SiN_x/SiO_y$.

Alternatively, the flexible display apparatus 1000 may include the gate insulating layer 210 and the inter-insulating layer 230, both of which may include a single-layered or multi-layered structure including the inorganic material. In such an embodiment, the gate insulating layer 210 and the inter-insulating layer 230 may be patterned to overlap only the second region D, and to expose the first region B that is bendable.

A source electrode S and a drain electrode D of the thin film transistor TFT may be disposed on the inter-insulating layer 230.

The source electrode S and the drain electrode D may include at least one metal material selected from Al, Pt, Pd, Ag, Mg, Au, Ni, Nd, Ir, Cr, Li, Ca, Mo, Ti, W, and Cu.

Alternatively, the source electrode S and the drain electrode D may include Al that may improve flexural properties when forming data lines SD of the first region B, and will be described in greater detail later.

A via layer 250 may be disposed on the inter-insulating layer 230 to cover the source electrode S and the drain electrode D on the inter-insulating layer 230. A pixel electrode 271 may be disposed on the via layer 250. According to an exemplary embodiment, as illustrated in FIG. 2, the pixel electrode 281 is connected to the drain electrode D via a via hole defined in the via layer 250.

The via layer 250 may include an insulating material. In one exemplary embodiment, for example, the via layer 250 may have a single-layered or a multi-layered structure including an inorganic material, an organic material, or an organic/inorganic compound material, provided by using various deposition methods. In some exemplary embodiments, the via layer 250 may include at least one selected from an polyacrylates resin, an epoxy resin, a phenolic resin, a polyamides resin, a polyimides resin, an unsaturated polyesters resin, a poly phenylenethers resin, a poly phenylenesulfides resin, and benzocyclobutene ("BCB").

Alternatively, the via layer 250 may include an organic material, and may be patterned in the first region B and the second regions D. However, if the via layer 250 including the organic material is disposed on the entire surface of the second regions D, a path of supplying moisture to the organic light-emitting diode OLED may be provided due to the organic material.

Therefore, in some exemplary embodiments, where the via layer 250, is the organic layer, a portion of the via layer 250 on the third region I that is formed at an edge of the second region D as shown in FIGS. 1 to 3 is removed, and then, the via layer 250 may be disposed to overlap only the second regions D and to expose the first region B and the third region I. This will be described in detail later.

The organic light-emitting diode OLED may be disposed on the via layer 250. The organic light-emitting diode OLED includes the pixel electrode 281, an intermediate layer 283 including an organic emission layer, and an opposite electrode 285. In such an embodiment, the organic light-emitting diode OLED may further include a pixel defining layer 270.

The pixel electrode 281 and/or the opposite electrode 285 may be transparent electrodes or reflective electrodes. In an exemplary embodiment, where the pixel electrode 281 and/or the opposite electrode 285 are transparent electrodes, the pixel electrode 281 and/or the opposite electrode 285 may include indium tin oxide ("ITO"), indium zinc oxide ("IZO"), ZnO, or $In_2O_3$. In an exemplary embodiment, where the pixel electrode 281 and/or the opposite electrode 285 are reflective electrodes, the pixel electrode 281 and/or the opposite electrode 285 may each include a reflective layer including Ag, Mg, Al, Pt, Pd, Au, Ni, Nd, Ir, Cr, or a compound thereof, and a transparent layer including ITO, IZO, ZnO, or $In_2O_3$. In some exemplary embodiments, the pixel electrode 281 or the opposite electrode 285 may have an ITO/Ag/ITO structure.

The intermediate layer 283 disposed between pixel electrode 281 and the opposite electrode 285 may include an organic emission layer.

Alternatively, the intermediate layer 283 includes the organic emission layer, and may further include at least one of a hole injection layer ("HIL"), a hole transport layer ("HTL"), an electron transport layer ("ETL"), and an electron injection layer ("EIL"). However, exemplary embodiments are not limited thereto. Alternatively, the intermediate layer 283 includes the organic emission layer and may further include various functional layers.

A spacer 290 (see FIG. 3) may be further disposed on the pixel defining layer 270. The spacer 290 may protrude upward from the pixel defining layer 270, and may be disposed in a way such that display characteristics is effectively prevented from being degraded due to external shock.

In an exemplary embodiment, the spacer 290 may be formed through a same manufacturing process using a same material as those of the pixel defining layer 270. In such an embodiment, the pixel defining layer 270 and the spacer 290 may be formed simultaneously by adjusting an exposure amount through an exposure process using a half-tone mask. However, one or more exemplary embodiments are not limited thereto, alternatively, the pixel defining layer 270 and the spacer 290 may be sequentially or separately formed. In another alternative exemplary embodiment, the pixel defining layer 270 and the spacer 290 may be provided as independent structures from each other by using different materials.

Hereinafter, the cross-sectional structure of the second regions D located at opposite sides of the first region B will be described in detail with reference to FIG. 3.

In an exemplary embodiment, as shown in FIG. 3 and as described above, the buffer layer 110, the gate insulating layer 210, gate lines GL, the inter-insulating layer 230, and the data lines SD are sequentially disposed on the substrate 100.

FIG. 3 shows that the buffer layer 110 is disposed on the substrate 100, but not being limited thereto. Alternatively, the buffer layer 110 may be omitted and the gate insulating layer 210 may be disposed directly on the substrate 100.

Alternatively, the buffer layer 110 may include an inorganic material, and may be selectively formed only in the second regions D, not in the first region B.

Alternatively, the gate insulating layer 210 and the inter-insulating layer 230 may include an inorganic material. In an exemplary embodiment, the gate insulating layer 210 and the inter-insulating layer 230 are not formed on the first region B at which the flexible display apparatus 1000 bends, but may be patterned only in the second regions D on the substrate 100.

An inorganic layer may have a single-layered structure or a stacked structure including metal oxide or metal nitride. Although the inorganic layer may prevent infiltration of oxygen or moisture, stress applied thereto may not be effectively reduced.

Thus, according to an exemplary embodiment of the flexible display apparatus 1000, the gate insulating layer 210 and the inter-insulating layer 230 including the inorganic material are substantially entirely removed from or not provided in the first region B by which the flexible display apparatus 1000 bends, and accordingly, the stress may be reduced and flexibility may be improved.

The data lines SD may be arranged on the inter-insulating layer 230. In an exemplary embodiment, the data lines SD may be arranged on the first region B to connect the gate lines GL of the second regions D at the opposite sides of the first region B to each other.

In such an embodiment, the data lines SD may be disposed directly on the substrate 100 in the first region B, so that an upper surface of the substrate 100 directly contacts the data lines SD.

In such an embodiment where the data lines SD connect the gate lines GL of the two second regions D that are separate from each other, signals may be transferred between the second regions D.

Alternatively, the data lines SD may include Al. Since the Al has high flexibility, the data lines SD may be formed to be curved on the substrate 100 in the first region B between the gate lines GL of the two second regions D.

In such an embodiment, when the first region B is bent, stress may not largely affect the data lines SD having high flexibility and the data lines SD are not likely to be shorted, and thus, the flexibility may be improved.

The via layer 250 may be disposed on the data lines SD.

The via layer 250 may include an organic material, and may be formed entirely on the first region B to cover the data lines SD.

Since the via layer 250 including the organic material is disposed on the data lines SD on the first region B that is bendable, the via layer 250 may absorb stress applied to the first region B and provides flexibility.

Therefore, according to an exemplary embodiment of the flexible display apparatus 1000, the inorganic layer on the substrate 100 is reduced or removed in the first region B and the organic layer and the data lines SD having high flexibility are only disposed on the substrate 100 in the first region B. Thus, in such an embodiment, the stress applied to the first region B may be reduced, and crack may not occur even when the bending is repeatedly performed.

The pixel defining layer 270 for defining pixel regions and the spacer 290 may be sequentially disposed on the via layer 250.

In some exemplary embodiment, the pixel defining layer 270 and the spacer 290 may both include an organic material, and as shown in FIG. 3, the pixel defining layer 270 and the spacer 290 may be omitted from the first region B and may be selectively patterned in the second region D.

Alternatively, the flexible display apparatus 1000 may further include a metal dam DAM disposed at an edge of each second region D to be spaced apart from the data lines SD with a predetermined distance.

In an exemplary embodiment, the metal dam DAM may be patterned at the same time when the data lines SD are formed by using the same material as that of the data lines SD, and may be formed at each of the second regions D located at the opposite sides of the first region B.

The via layer 250, the pixel defining layer 270 and the spacer 290 may be sequentially disposed on the metal dam DAM.

In such an embodiment, where the metal dam DAM is disposed on the inter-insulating layer 230, and the via layer 250, the pixel defining layer 270 and the spacer 290 are disposed on the metal dam DAM, the edge of the second region D is relatively higher.

In such an embodiment, since the edge of the second region D is relatively higher than the first region B and the other portion of the second region D, on which the metal dam DAM is not formed, infiltration of moisture into the organic light-emitting diode OLED that is located at an inner portion of the second region D may be effectively prevented.

The third region I may be between the metal dam DAM and an end portion of the data lines SD.

In such an embodiment, a moisture transferring path is not formed in the third region I, and the via layer 250, the pixel defining layer 270 and the spacer 290 including the organic material may not be formed on the third region I.

In such an embodiment, the via layer 250, the pixel defining layer 270 and the spacer 290 may be patterned in the second region D, except for the third region I.

Although the layer including the organic material relives the stress and improves the flexibility, a path for transferring moisture or oxygen may be provided due to the organic material.

Therefore, in an exemplary embodiment, layers including the organic material are substantially entirely removed from the third region I not to provide the path of transferring the moisture, and then, only inorganic layers, e.g., the gate insulating layer 210, the inter-insulating layer 230 and the gate lines GL, may be formed on the substrate 100 in the third region I.

In an exemplary embodiment of the flexible display apparatus 1000, the inorganic layers, e.g., the gate insulating layer 210 and the inter-insulating layer 230, are substantially entirely removed from the first region B and formed only on the second region D, and the organic layer, e.g., the via layer 250, is substantially entirely removed from the third region I to be formed only in the first region B and the second region D except the third region I.

In such an embodiment, the organic layers, e.g., the pixel defining layer 270 and the spacer 290, may be patterned within the second region D. In such an embodiment, the pixel defining layer 270 and the spacer 290 may be substantially entirely removed from the third region I and a part of the second region D, which is located on an outer portion of the third region I, and may be patterned on the metal dam DAM and the second region D inside the metal dam DAM.

Accordingly, in such an embodiment, the pixel defining layer 270 and the spacer 290 may not overlap the region from the first region B to the third region I, and may be patterned only in the third region I, that is, on the metal dam DAM and the second region D inside the metal dam DAM.

Accordingly, the inorganic layer may not be formed on the first region B that is the bending portion, and then, the data lines SD and the via layer 250 that is the organic layer are formed only on the first region B. Thus, the stress may be relieved and the flexibility is improved.

In such an embodiment, the organic layers are not formed on the edge of the second region D, on which the organic light-emitting diode OLED is formed, and then, the third region I, on which the inorganic layers, e.g., the gate insulating layer 210, the inter-insulating layer 230 and the gate lines GL, are only formed, is located at the edge of the second region D. Accordingly, the path through which the moisture transfers into the organic light-emitting diode OLED from the outside may be blocked.

In such an embodiment, the metal dam DAM that is spaced apart from the data lines SD with a predetermined distance is disposed on the edge of the second region D including the organic light-emitting diode OLED, and the via layer 250, the pixel defining layer 270 and the spacer 290 are sequentially disposed on the metal dam DAM. Thus, the edge of the second region D is relatively higher than peripheral regions, and thus, the infiltration of the moisture from the outside may be effectively prevented.

In an exemplary embodiment, the flexible display apparatus 1000 may include a thin film encapsulation portion 300a on an upper portion of the display unit 200 to completely seal the display unit 200, to thereby protect the display unit 200 against external moisture or oxygen.

The thin film encapsulation portion 300a may be disposed on the display unit 200, and opposite ends of the thin film encapsulation portion 300a may be coupled, e.g., adhered, to the substrate 100.

In some exemplary embodiments, the thin film encapsulation portion 300a has a structure in which a plurality of thin film layers are stacked, that is, inorganic layers and organic layers may be alternately stacked.

The inorganic layers may effectively prevent the infiltration of oxygen or moisture, and the organic layers may absorb stress applied to the inorganic layer to grant the flexibility.

The inorganic layer may be a single layer or a stacked layer including metal oxide or metal nitride. The inorganic layers may include one of $SiN_x$, $Al_2O_3$, $SiO_2$, and $TiO_2$.

The organic layer may include a polymer, and may be a single layer or a stacked layer including, for example, one of polyethylene terephthalate, polyimide, polycarbonate, epoxy, polyethylene, and polyacrylate. In an exemplary embodiment, the organic layers may include polyacrylate. In one exemplary embodiment, for example, the organic layer may include a polymerized monomer composition including diacrylate-based monomer and triacrylate-based monomer. The monomer composition may further include monoacrylate-based monomer. Also, the monomer composition may further include a well-known photoinitiator such as trimethyl benzoyl diphenyl phosphine oxide ("TPO"), but exemplary embodiments are not limited thereto.

In an exemplary embodiment, the inorganic layer is removed only from the first region B that is the bending portion, but is not limited thereto. In an alternative exemplary embodiment, the second region D may include a region from which the inorganic layer is removed as in the first region B.

In an exemplary embodiment, the second region D may also have a bending region, and in the bending region, the inorganic layer may be removed to relieve the stress and improve the flexibility within a range of maintaining connections between wires. Therefore, the region from which the inorganic layer is removed is not limited to the first region B between the two second regions D, as described above.

Figure 4:
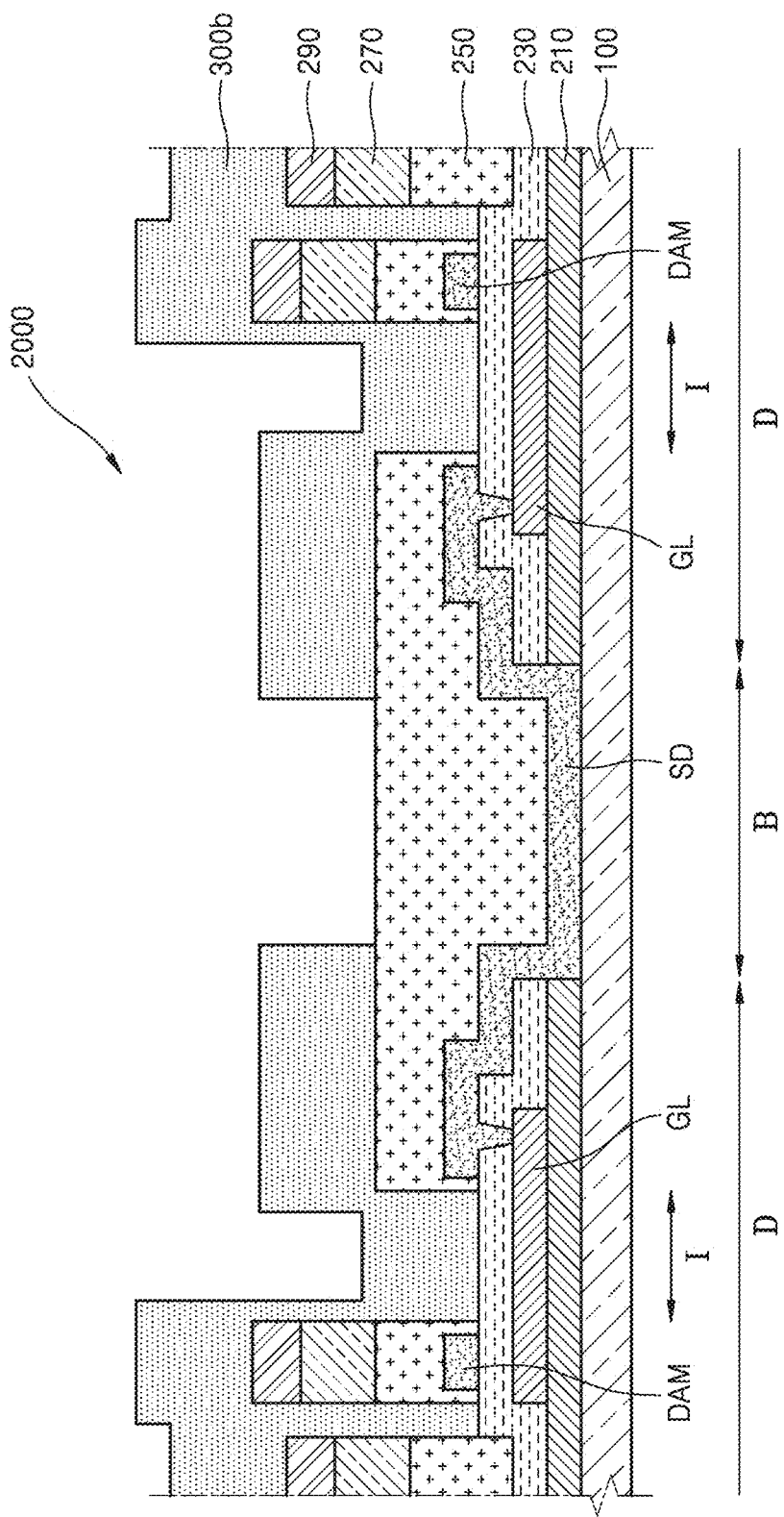
FIG. 4 is a cross-sectional view of a first region in a flexible display apparatus according to an alternative exemplary embodiment.

FIG. 4 is a cross-sectional view of a flexible display apparatus 2000 according to an alternative exemplary embodiment, based on the first region B. The same or like elements shown in FIG. 4 have been labelled with the same reference characters as used above to describe the exemplary embodiments of the flexible display apparatus in FIGS. 1 to 3, and any repetitive detailed description thereof will hereinafter be omitted or simplified.

In such an embodiment, as shown in FIG. 4, the inorganic layers, e.g., the gate insulating layer 210 and the inter-insulating layer 230, are removed in the first region B, and may be disposed entirely in the second region D on the substrate 100.

In such an embodiment, the data lines SD may be directly arranged on the substrate 1000 in the first region B.

The gate lines GL may be disposed on the gate insulating layer 210 and under the inter-insulating layer 230 in the second region D.

The data lines SD may be disposed on the inter-insulating layer 230, and the data lines SD may connect the gate lines GL of the two second regions D that are located at the opposite sides of the first region B.

The metal dam DAM that is spaced apart from the data lines SD with a predetermined distance may be formed at an edge of the second region D. The metal dam DAM may be patterned at the same time when the data lines SD are patterned by using the same material as the data lines SD.

The via layer 250 may be disposed on the data lines SD. The via layer 250 may include an organic layer that may be formed on the data lines SD entirely in the first region and may be patterned within the second region D.

In such an embodiment, the via layer 250 is substantially entirely removed from the third region I that is between the data lines SD and the metal dam DAM, and may be formed on (or disposed to overlap when viewed from a plan view in a thickness direction of the flexible display apparatus) the first region B and the second region D except the third region I.

The pixel defining layer 270 and the spacer 290 including the organic material may be sequentially formed on the via layer 250, and may be patterned on the metal dam DAM and inside the metal dam DAM on the second region D. That is, the pixel defining layer 270 and the spacer 290 may not be formed on the third region I, a portion of the second region D outside the third region I, and the first region B.

Accordingly, the inorganic layers are substantially entirely removed from the first region B that is the bending portion, and the data lines SD and the organic layer, that is, the via layer 250, are only formed on the first region B so that the stress applied to the first region B may be relieved and the flexibility may be improved.

In such an embodiment, the organic layers are substantially entirely removed from the edge of the second region D, on which the organic light-emitting diode OLED is formed, and then, the third region I on which the inorganic layers, e.g., the gate insulating layer 210, the inter-insulating layers 230 and the gate lines GL are only formed, is located at the edge of the second region D. Accordingly, the path through which the moisture transfers from the outside toward the organic light-emitting diode OLED may be blocked.

In such an embodiment, the metal dam DAM that is spaced apart from the data lines SD with a predetermined distance is disposed on the edge of the second region D, on which the organic light-emitting diode OLED is formed, and the via layer 250, the pixel defining layer 270 and the spacer 290 are sequentially disposed on the metal dam DAM. Thus, the edge of the second region D is relatively higher and performs as a dam for preventing infiltration of the moisture from the outside.

According to an exemplary embodiment, the flexible display apparatus 2000 may further include a thin film encapsulation portion 300b on the display unit 200 to completely seal the display unit 200, to thereby protect the display unit 200 against the external moisture or oxygen.

The thin film encapsulation portion 300b may have a structure, in which a plurality of thin film layers are stacked one on another, for example, inorganic layers and organic layers may be alternately stacked.

The thin film encapsulation portion 300b in the flexible display apparatus 2000 may be disposed on the entire surface of the substrate 100, except the first region B.

The thin film encapsulation portion 300b has a predetermined thickness, and thus, the thin film encapsulation portion 300b is substantially entirely removed from the first region B, which is the bending portion, so that the first region B may be relatively thin in thickness. Therefore, the stress may be relieved and a possibility of occurring crack in the flexible display apparatus 2000 may be reduced.

In some other exemplary embodiments, the inorganic layers in the thin film encapsulation portion 300b, in which the organic layers and the inorganic layers are alternately stacked, may be disposed on the first region B so that the organic layers remain only on the first region B. Since the organic layer relieves the stress and improves the flexibility, the stress applied to the first region B may be relieved provided that the organic layers are formed on the via layer 250 of the first region B.

Figure 5:
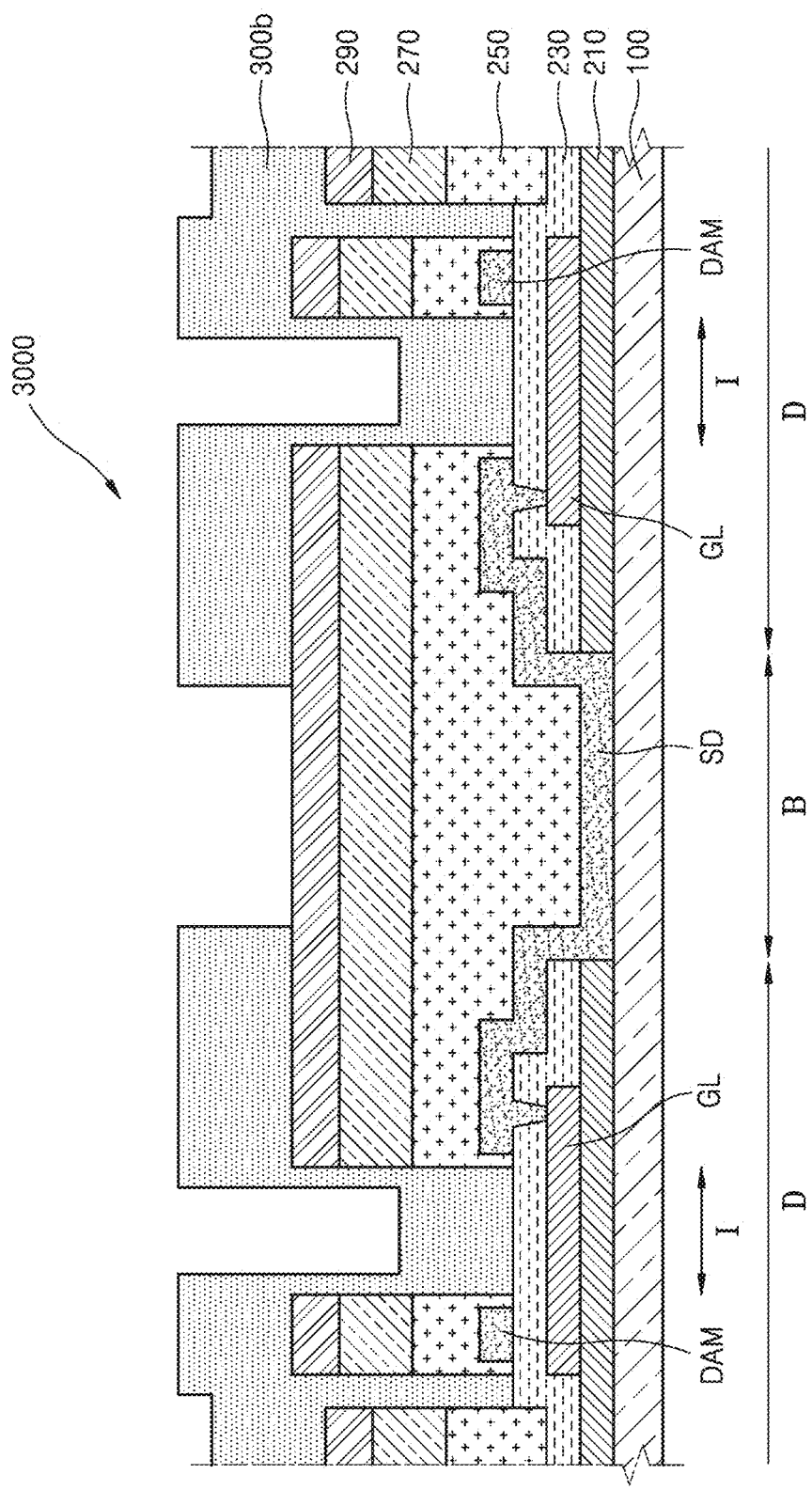
FIG. 5 is a cross-sectional view of a first region in a flexible display apparatus according to another alternative exemplary embodiment.

FIG. 5 is a cross-sectional view of a flexible display apparatus 3000 according to another alternative exemplary embodiment, based on the first region B. The same or like elements shown in FIG. 5 have been labelled with the same reference characters as used above to describe the exemplary embodiments of the flexible display apparatus in FIGS. 1 to 3, and any repetitive detailed description thereof will hereinafter be omitted or simplified.

In an exemplary embodiment of the flexible display apparatus 3000 shown in FIG. 5, the inorganic layers, e.g., the gate insulating layer 210 and the inter-insulating layer 230, are substantially entirely removed from the first region B, and may be formed entirely in the second region D on the substrate 100.

In such an embodiment, the data lines SD are disposed directly on the substrate 100 in the first region B, and the gate lines GL may be disposed on the gate insulating layer 210 and under the inter-insulating layer 230 in the second region D.

The data lines SD may be disposed on the inter-insulating layer 230, and the data lines SD are disposed entirely on the first region B to connect the gate lines GL of the two second regions D located at the opposite sides of the first region B.

The metal dam DAM that is spaced apart from the data lines SD with a predetermined distance may be disposed at the edge of the second region D. The metal dam DAM may be patterned at the same time when forming the data lines SD by using the same material as that of the data lines SD.

The via layer 250 may be disposed on the data lines SD. The via layer 250 may include an organic layer, and may be disposed on the data lines SD entirely in the first region B and may be patterned in the second region D.

In such an embodiment, the via layer 250 is substantially entirely removed from the third region I that is between the data lines SD and the metal dam DAM, and may be formed on the first region B and the second region D except the third region I.

The pixel defining layer 270 and the spacer 290 including the organic material may be sequentially disposed on the via layer 250. Like the via layer 250, the pixel defining layer 270 and the spacer 290 may be disposed to overlap the first region B and the second region D except the third region I.

Alternatively, the via layer 250, the pixel defining layer 270 and the spacer 290 may be all include the organic material, and may be sequentially disposed on the data lines SD in the first region B that is the bending portion.

In such an embodiment, since the organic layers, e.g. the via layer 250, the pixel defining layer 270 and the spacer 290 for relieving the stress and improving the flexibility, are disposed on the data lines SD in the first region B, the stress may not accumulate and crack may not occur even if the first region B is repeatedly bent.

In such an embodiment, the organic layers, e.g., the via layer 250, the pixel defining layer 270 and the spacer 290, are substantially entirely removed from the third region I so that the via layer 250, the pixel defining layer 270 and the spacer 290 are only disposed or patterned in the second region D except the third region I.

Accordingly, the organic layers are all removed in the third region I, and only the inorganic layers, e.g., the gate insulating layer 210, the gate lines GL and the inter-insulating layer 230, are disposed on the substrate 100, such that the path of transferring moisture into the second region D may be blocked.

Alternatively, the thin film encapsulation portion 300b, in which the inorganic layers and the organic layers are alternately stacked, may be disposed on the display unit 200 to completely seal the display unit 200 against the external moisture or oxygen.

In an exemplary embodiment of the flexible display apparatus 3000, the thin film encapsulation portion 300b may be disposed on the substrate 100, except the first region B.

Since the thin film encapsulation portion 300b has a predetermined thickness, the thin film encapsulation portion 300b is substantially entirely removed from the first region B that is the bending portion to relieve the stress and to reduce the possibility of generating crack.

Figure 6:
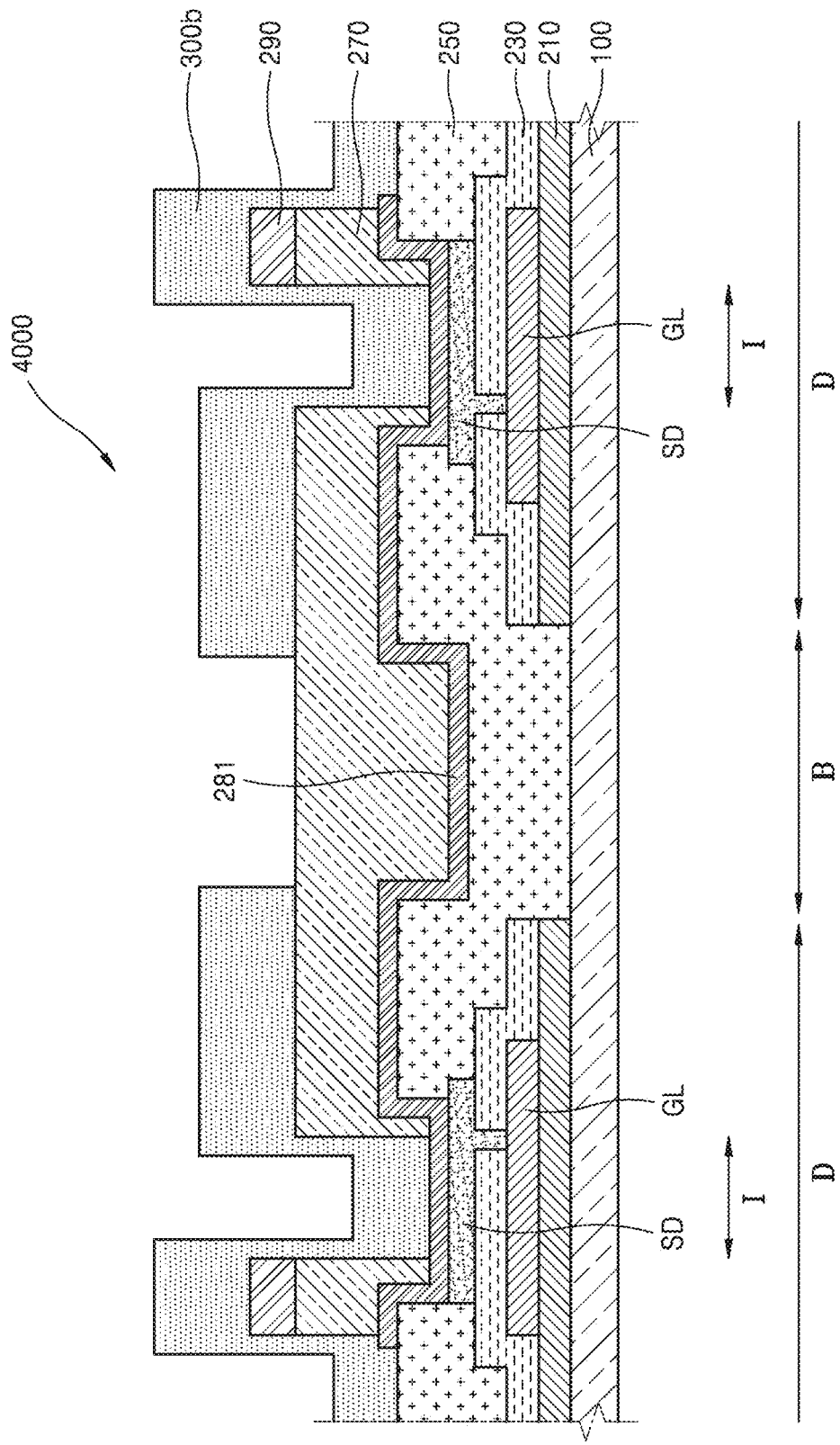
FIG. 6 is a cross-sectional view of a first region in a flexible display apparatus according to another alternative exemplary embodiment.

FIG. 6 is a cross-sectional view of a flexible display apparatus 4000 according to another alternative exemplary embodiment, based on the first region B. The same or like elements shown in FIG. 6 have been labelled with the same reference characters as used above to describe the exemplary embodiments of the flexible display apparatus in FIGS. 1 to 4, and any repetitive detailed description thereof will hereinafter be omitted or simplified.

In an exemplary embodiment of the flexible display apparatus 4000, as shown in FIG. 6, the inorganic layers, e.g., the gate insulating layer 210 and the inter-insulating layer 230, are substantially entirely removed from the first region B, and may be disposed entirely in the second region D on the substrate 100.

The gate lines GL may be disposed on the gate insulating layer 210 and under the inter-insulating layer 230, and the data lines SD are disposed on the inter-insulating layer 230 to contact the gate lines GL.

The via layer 250 may be disposed on the data lines SD. The via layer 250 may include an organic layer, and may be patterned in the second region D. In such an embodiment, the via layer 250 including the organic layer may be disposed on the first region B.

As will be described later, since the data lines SD contact the pixel electrode 281 located thereon, the via layer 250 may be patterned in the second region D to expose at least a part of the data lines SD.

In an exemplary embodiment of the flexible display apparatus 4000, the gate insulating layer 210, the gate lines GL, the inter-insulating layer 230 and the data lines SD are not formed in the first region B, and thus, the via layer 250 may be disposed directly on the substrate 100.

The pixel electrode 281 may be disposed on the via layer 250.

Alternatively, the pixel electrode 281 may be disposed on the via layer 250 entirely in the first region B. In an exemplary embodiment, since the pixel electrode 281 contacts the data lines of the second regions D located at the opposite sides of the first region B, the pixel electrode 281 may connect the lines of the two second regions D to each other.

The via layer 250 is patterned or has a patterned structure to expose a part of the data lines SD as described above, and the pixel electrode 281 may be disposed on the data lines SD to cover the ends of the via layer 250. However, one or more exemplary embodiments are not limited thereto, and the pixel electrode 281 may be formed in another way such that the data lines SD in adjacent second regions D may be connected to each other therethrough.

The pixel defining layer 270 may be disposed on the pixel electrode 281.

Alternatively, the pixel defining layer 270 may include an organic layer, and may be disposed on the pixel electrode 281 entirely in the first region B.

The pixel defining layer 270 may be patterned so that a part of the pixel defining layer 270 may be removed at the edge of the second region D.

On the region where the via layer 250 is removed, the pixel defining layer 270 may be also removed. Then, such a region where the via layer 250 and the pixel defining layer 270 are removed in the second region D may define the third region I that removes the path of transferring the moisture and locates at the edge of the second region D.

In such an embodiment, as shown in FIG. 6, the inorganic layers, e.g., the gate insulating layer 210, the inter-insulating layer 230, the gate lines GL, the data lines SD and the pixel electrode 281 that include metal may be formed only in the third region I on the substrate 100.

In the third region I including a part of the data lines SD, the organic layers are removed, and thus, the movement of the moisture and oxygen into the second region D via the organic layers may be prevented.

The spacer 290 may be disposed on the pixel defining layer 270, and the spacer 290 is substantially entirely removed from the first region B and the third region I and partially patterned on the second region D except the third region I.

The spacer 290 may include the organic layer, and although not shown in FIG. 6, the spacer 290 may be selectively formed on the pixel defining layer 270 in the first region B.

In an exemplary embodiment of the flexible display apparatus 4000, the organic layers, e.g., the via layer 250, the pixel defining layer 270 and the pixel electrode 281 between the via layer 250 and the pixel defining layer 270, are formed only in the first region B on the substrate 100, and thus, the flexibility may be maximized. In such an embodiment, minimum metal wires are provided to connect the lines between the two second regions D, and thus, the stress may be relived and the possibility of generating crack may be reduced even when the first region B is bent repeatedly.

In an exemplary embodiment, the thin film encapsulation portion 300b, in which the inorganic layers and the organic layers are alternately stacked, may be disposed on the display unit 200 to completely seal the display unit 200 against the external moisture or oxygen.

In such an embodiment of the flexible display apparatus 4000, the thin film encapsulation portion 300b may be disposed entirely on the substrate 100 except the first region B.

Since the thin film encapsulation portion 300b has a predetermined thickness, the thin film encapsulation portion 300b is substantially entirely removed from the first region B that is the bending portion to relieve the stress and to reduce the possibility of generating crack.

Figure 7:
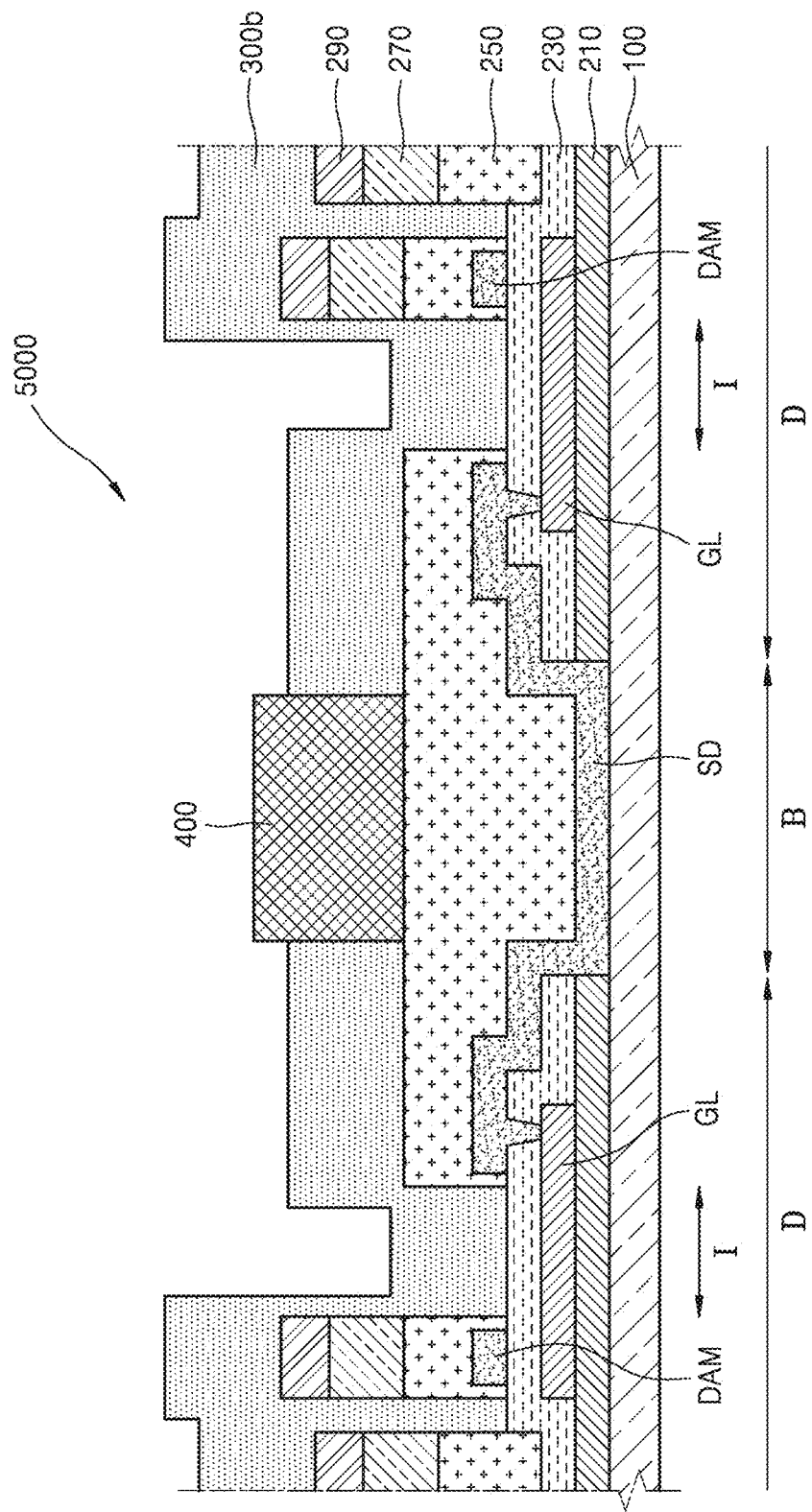
FIG. 7 is a cross-sectional view of a first region in a flexible display apparatus according to another alternative exemplary embodiment.

FIG. 7 is a cross-sectional view of a flexible display apparatus 5000 according to another alternative exemplary embodiment, based on the first region B. The same or like elements shown in FIG. 7 have been labelled with the same reference characters as used above to describe the exemplary embodiments of the flexible display apparatus in FIGS. 1 to 4, and any repetitive detailed description thereof will hereinafter be omitted or simplified.

The flexible display apparatus 5000 shown in FIG. 7 is similar to the flexible display apparatus 2000 illustrated in FIG. 4, and thus, differences of the flexible display apparatus 5000 from the flexible display apparatus 2000 will be described below.

In an exemplary embodiment, as shown in FIG. 7, the thin film encapsulation portion 300b may be disposed on the display unit 200 to completely seal the display unit 200 against the external moisture or oxygen.

The thin film encapsulation portion 300b may have a structure in which a plurality of thin film layers, e.g., inorganic layers and organic layers, may be stacked alternately one on another.

In an exemplary embodiment, the thin film encapsulation portion 300b may be disposed on the entire surface of the substrate 100 except the first region B.

Since the thin film encapsulation portion 300b has a predetermined thickness, the thin film encapsulation portion 300b is substantially entirely removed from the first region B that is the bending portion to relieve the stress and to reduce the possibility of generating crack.

In an exemplary embodiment, since the first region B, on which the thin film encapsulation portion 300b is removed, may be more vulnerable to the external moisture or oxygen than the second region D, a molding portion 400 may be disposed on the first region B after bending the first region B.

In such an embodiment, where the molding portion 400 may be disposed on the display unit 200 in the first region B, on which the thin film encapsulation portion 300b is removed, the molding portion 400 may include a waterproof coating agent.

Accordingly, in such an embodiment of the flexible display apparatus 5000, the stress applied to the first region B is relieved even when a thickness of the first region B is reduced and the first region B is bent repeatedly. In such an embodiment, where the molding portion 400 is provided, infiltrating the external moisture or oxygen into the first region B is effectively prevented, and thus, occurrence of crack may be effectively prevented and the organic light-emitting diode OLED may be protected at the same time.

Figure 8:
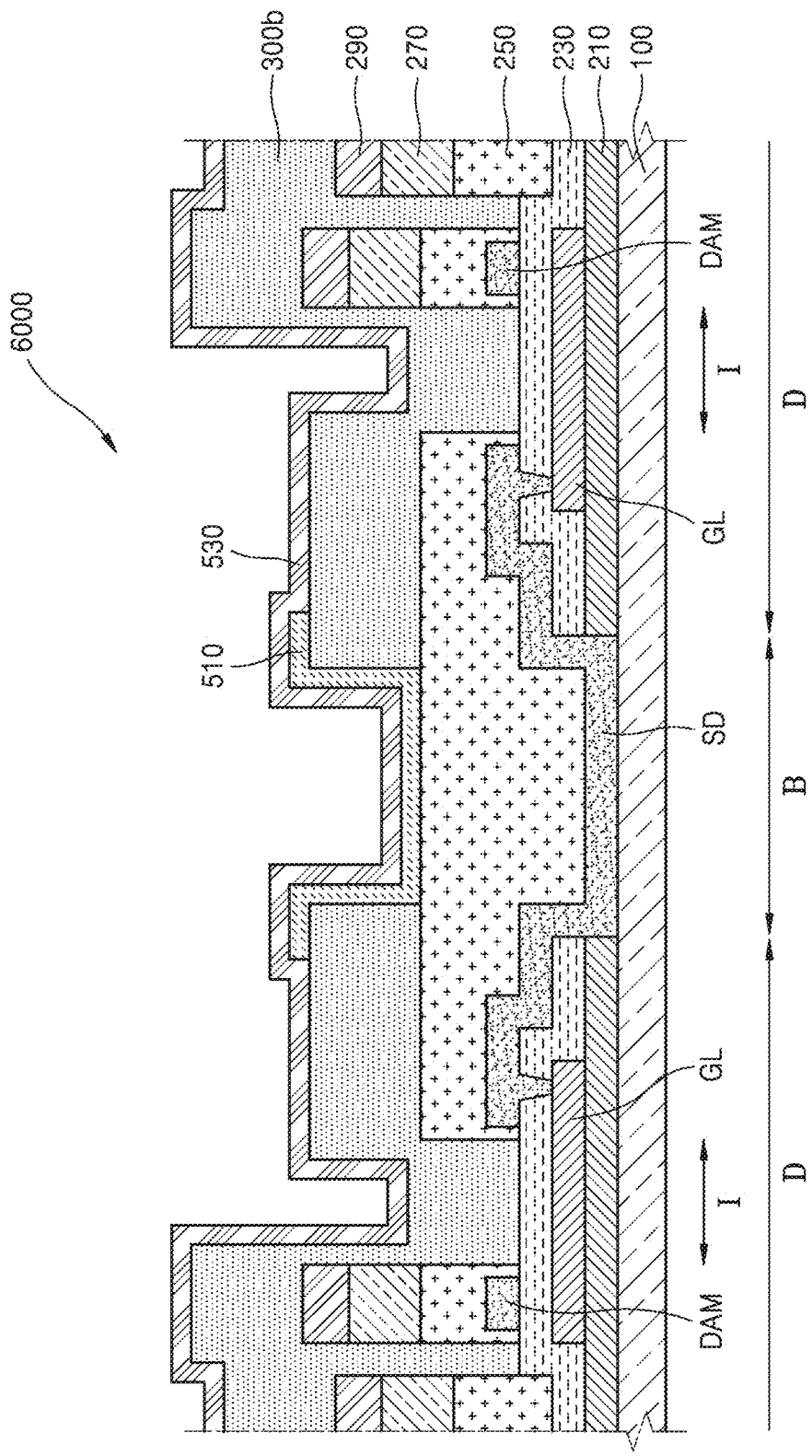
FIG. 8 is a cross-sectional view of a first region in a flexible display apparatus according to another alternative exemplary embodiment.

FIG. 8 is a cross-sectional view of the flexible display apparatus 6000 according to another alternative exemplary embodiment, based on the first region B. The same or like elements shown in FIG. 8 have been labelled with the same reference characters as used above to describe the exemplary embodiments of the flexible display apparatus in FIGS. 1 to 4, and any repetitive detailed description thereof will hereinafter be omitted or simplified.

Since the flexible display apparatus 6000 shown in FIG. 8 is similar to the flexible display apparatus 2000 illustrated in FIG. 4, differences of the flexible display apparatus 6000 from the flexible display apparatus 2000 will be described below.

An exemplary embodiment of the flexible display apparatus 6000 may further include a touch screen panel ("TSP") wire or line 510 on the thin film encapsulation portion 300b.

The TSP line 510 is a line for sensing a touch of a user, and is not disconnected in the first region B to be connected between the two second regions D at the opposite sides of the first region B.

If the TSP line 510 is stacked at the same location as the data line SD disposed under the TSP line 510, a parasitic capacitor may occur. Therefore, the data lines SD and the TSP line 510 above the data lines SD may not be arranged in parallel with each other.

In such an embodiment, a TSP protective organic layer 530 may be disposed on the TSP line 510 to protect the TSP line 510 on the thin film encapsulation portion 300b. The TSP protective organic layer 530 may completely seal the TSP line 510 and the structures under the TSP line 510. In such an embodiment, since the organic layer provides flexibility, the TSP protective organic layer 530 may be disposed on the TSP line 510 in the first region B.

The TSP protective organic layer 530 may include at least one selected from polyacrylates resin, epoxy resin, phenolic resin, polyamides resin, polyimides resin, unsaturated polyesters resin, poly phenylenethers resin, and poly phenylenesulfides resin.

According to exemplary embodiments, the stress applied to the flexible display apparatus may be relived even when the flexible display apparatus is bent by a predetermined angle or greater.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a substrate;
   a gate insulating layer comprising an inorganic layer and disposed on the substrate;
   first lines disposed on the gate insulating layer;
   an inter-insulating layer comprising an inorganic layer and covering the first line; and
   a second line disposed on the inter-insulating layer,
   wherein the flexible display apparatus has a first region which is bendable and second regions at opposite sides of the first region, respectively,
   wherein the gate insulating layer includes a first opening corresponding to the first region, the inter-insulating layer includes a second opening corresponding to the first region, and
   the second line disposed in the first region connects the first lines disposed in the second regions, respectively, to each other.

2. The flexible display apparatus of claim 1, further comprising:
   a metal dam at an edge of each of the second regions, and
   a via layer comprising an organic layer and covering the second line and the metal dam,
   wherein the metal dam is spaced apart from the second line with a predetermined distance, and
   the via layer includes a third opening corresponding to a third region, which is between an end portion of the second line and the metal dam within each second region.

3. The flexible display apparatus of claim 1, wherein the second line is disposed in the first opening and in the second opening.

4. The flexible display apparatus of claim 2, wherein the metal dam and the second line are disposed in a same layer and comprise a same material as each other.

5. The flexible display apparatus of claim 2, further comprising:
   a pixel defining layer disposed on the via layer,
   wherein the pixel defining layer includes a fourth opening corresponding to the first region and the third region.

6. The flexible display apparatus of claim 5, further comprising:
   a thin film encapsulation portion disposed on the pixel defining layer,
   wherein the second line, the via layer and the thin film encapsulation portion are sequentially disposed on the substrate in the first region.

7. The flexible display apparatus of claim 6, wherein the thin film encapsulation portion is disposed on the substrate entirely in the second region, except the first region.

8. The flexible display apparatus of claim 7, further comprising:
   a molding portion disposed on the via layer in the first region, on which the thin film encapsulation portion is not disposed,
   wherein the molding portion comprises a waterproof coating agent.

9. The flexible display apparatus of claim 7, further comprising:
   a touch screen panel line disposed on the via layer in the first region, in which the thin film encapsulation portion is not disposed, and
   a touch screen panel protective organic layer disposed on the touch screen panel line.

10. A flexible display apparatus comprising:
    a substrate including a first area, a second area, and a bending region;
    a gate insulating layer comprising a first gate insulating layer disposed over the first area and a second gate insulating layer disposed over the second areas, the second gate insulating layer spaced apart from the first gate insulating layer;
    a first conductive layer disposed on the first gate insulating layer in the first area;
    a second conductive layer disposed on the second gate insulating layer in the second area;
    an inter-insulating layer comprising a first inter-insulating layer covering the first conductive layer and a second inter-insulating layer covering the second conductive layer, the second inter-insulating layer spaced apart from the first inter-insulating layer;
    a connection line disposed on the inter-insulating layer,
    wherein the connection line extends from the first inter-insulating layer to the second insulating layer across a third area between the first area and the second area and connects the first conductive line in the first area and the second conductive line in the second area.

11. The flexible display apparatus of claim 10,
    wherein the first inter-insulating layer includes a first contact hole and the second inter-insulating layer includes a second contact hole, and
    the connection line is connected to the first conductive layer and the second conductive layer, respectively, via the first contact hole and the second contact hole.

12. The flexible display apparatus of claim 10, further comprising display elements in the at least one of the first area or the second area.

13. The flexible display apparatus of claim 10, further comprising metal dams at an edge of the first area and the second area, respectively,
    wherein the metal dams are disposed apart from the connection line with a predetermined distance.

* * * * *